(12) United States Patent
Uchiyama

(10) Patent No.: US 8,969,935 B2
(45) Date of Patent: Mar. 3, 2015

(54) SEMICONDUCTOR MEMORY DEVICE HAVING PLURAL CELL CAPACITORS STACKED ON ONE ANOTHER AND MANUFACTURING METHOD THEREOF

(75) Inventor: Hiroyuki Uchiyama, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/439,423

(22) Filed: Apr. 4, 2012

(65) Prior Publication Data

US 2012/0248520 A1 Oct. 4, 2012

(30) Foreign Application Priority Data

Apr. 4, 2011 (JP) .................................. 2011-082375

(51) Int. Cl.
*H01L 27/108* (2006.01)
*H01L 49/02* (2006.01)

(52) U.S. Cl.
CPC .......... *H01L 27/10814* (2013.01); *H01L 28/90* (2013.01); *H01L 28/86* (2013.01); *H01L 27/10817* (2013.01)
USPC .................................. 257/296; 257/E27.084

(58) Field of Classification Search
CPC .................. H01L 27/10814; H01L 27/10817; H01L 28/86; H01L 28/90
USPC ............. 257/68, 71, 277, 296–313, 516, 532, 257/535, E27.016–E27.045, E27.071, 257/E27.087–E27.095, E29.218
See application file for complete search history.

(56) References Cited

U.S. PATENT DOCUMENTS

| | | | | |
|---|---|---|---|---|
| 5,155,657 A | * | 10/1992 | Oehrlein et al. | 361/313 |
| 5,583,359 A | * | 12/1996 | Ng et al. | 257/306 |
| 5,903,430 A | | 5/1999 | Takaishi | |
| 6,127,220 A | * | 10/2000 | Lange et al. | 438/254 |
| 6,197,633 B1 | | 3/2001 | Schindler et al. | |
| 7,919,803 B2 | | 4/2011 | Yokoi | |
| 2002/0182798 A1 | * | 12/2002 | Saito et al. | 438/211 |
| 2006/0186449 A1 | | 8/2006 | Uchiyama | |
| 2009/0078981 A1 | * | 3/2009 | Yokoi | 257/306 |

FOREIGN PATENT DOCUMENTS

| | | |
|---|---|---|
| JP | 07-161832 | 6/1995 |
| JP | 09-266292 A | 10/1997 |
| JP | 2000-503812 | 3/1999 |
| JP | 03-153074 | 5/2003 |
| JP | 2006-216649 A | 8/2006 |
| JP | 2009-076639 A | 4/2009 |

* cited by examiner

*Primary Examiner* — Fernando L Toledo
*Assistant Examiner* — Lawrence-Linh T Nguyen

(57) ABSTRACT

Disclosed herein is a device that includes a semiconductor substrate having a first area, a plurality of cell transistors arranged on the first area of the semiconductor substrate, and a plurality of cell capacitors each coupled to an associated one of the cell transistors, the cell capacitors being provided so as to overlap with one another on the first area.

6 Claims, 20 Drawing Sheets

SEMICONDUCTOR MEMORY DEVICE HAVING PLURAL CELL CAPACITORS STACKED ON ONE ANOTHER AND MANUFACTURING METHOD THEREOF

BACKGROUND OF THE INVENTION

1. Field of the Invention

The present invention relates to a semiconductor memory device and a manufacturing method thereof, and more particularly relates to a semiconductor memory device having cell capacitors and a manufacturing method of the semiconductor memory device.

2. Description of Related Art

Generally, in a DRAM (Dynamic Random Access Memory), a cell transistor and a cell capacitor that constitute one memory cell are stacked in a perpendicular direction (a normal direction of a semiconductor substrate). The reason for adopting such a stacked structure is to reduce the total area of a memory cell area. Meanwhile, in such a stacked structure, an area allocatable to one cell capacitor (an area of a cell capacitor in a direction parallel to a surface of a semiconductor substrate, hereinafter, "allocatable area") is restricted to an area equal to or smaller than that of one cell transistor (hereinafter, "cell area"). Therefore, the allocatable area decreases year after year under the circumstances that the cell area decreases year after year following the development of downsizing technologies. Accordingly, when the stacked structure is adopted, it is necessary to take various measures to secure a necessary capacity of the cell capacitor.

In an example of these measures, a facing direction in which an upper electrode faces a lower electrode is set to a horizontal direction (a direction parallel to a surface of a substrate). A cell capacitor in this example (hereinafter, "vertical capacitor") has a property of having a larger electrode area as the height of the vertical capacitor becomes larger. Therefore, it is possible to secure a necessary capacity by increasing the height of the vertical capacitor even in the case that the cell area is small. Examples of such a vertical capacitor are disclosed in Japanese Patent Application Laid-open Nos. 2006-216649, 2009-076639, and H09-266292.

However, the vertical capacitor has a problem that a processing margin becomes smaller as the height of the vertical capacitor is larger. Therefore, while the vertical capacitor is helpful from a viewpoint of securing a minimum capacity necessary to operate functions of a DRAM, it is inaptitude to allow the capacity to have a leeway. That is, it is effective for the DRAM to give a sufficient margin to the capacity of the cell capacitor from a viewpoint of the improvement in refresh characteristics. But it is difficult for the capacity of the vertical capacitor to have such a margin from a viewpoint of ensuring a yield ratio.

Furthermore, it is generally necessary to configure a capacitor such that the thicknesses of upper and lower electrodes are equal to or larger than a certain value in a direction perpendicular to a facing direction in which the upper electrode faces the lower electrode. In the vertical capacitor, the thicknesses of these electrodes are those in a horizontal direction. However, the thicknesses in the horizontal direction are restricted by the cell area. As a result, along with the further development in the downsizing of cell transistors, it becomes difficult to ensure that the thicknesses are equal to or larger than the certain value, and therefore it is predicted that adopting vertical capacitors becomes difficult in the first place.

SUMMARY

In one embodiment, there is provided a semiconductor memory device that includes: a semiconductor substrate having a first area; a plurality of cell transistors arranged on the first area of the semiconductor substrate; and a plurality of cell capacitors each coupled to an associated one of the cell transistors, the cell capacitors being provided so as to overlap with one another on the first area.

In another embodiment, there is provided a semiconductor memory device that includes: a plurality of cell transistors; a plurality of lower electrode layers insulated from one another; an upper electrode covering the lower electrodes via a capacitor insulating film; and a plurality of contact plugs each connecting one of the cell transistors to an associated different one of the lower electrode layers.

In still another embodiment, there is provided a manufacturing method of a semiconductor memory device, that includes: forming a transistor layer on a semiconductor substrate, the transistor layer including a plurality of cell transistors each having a connection node; forming a stacked structure on the cell transistor layer, the stacked structure having a structure in which a plurality of insulating layers and a plurality of lower electrodes are alternately stacked; forming a plurality of first through holes in the stacked structure, each of the first through holes exposing the connection node of an associated one of the cell transistor; forming sidewall insulating films on inner walls of the first through holes, each of the sidewall insulating films having an opening exposing different one of the lower electrodes from one another; forming contact plugs by burying conductive materials in the first through holes after forming the sidewall insulating films, each of the contact plugs connecting the connection node of an associated one of the cell transistors to an associated one of the lower electrodes; forming a second through hole in the stacked structure; removing the insulating layers by introducing an etchant via the second through hole; forming a capacitor insulating film on a surface of each of the lower electrodes exposed by the removing; and forming an upper electrode on the capacitor insulating film.

BRIEF DESCRIPTION OF THE DRAWINGS

FIGS. 5A to 20B are schematic cross-sectional views showing the semiconductor memory device 1 during its manufacturing process, the drawings denoted with "A" correspond to FIG. 2A, and those denoted with "B" correspond to FIG. 2B.

DETAILED DESCRIPTION OF THE EMBODIMENTS

Preferred embodiments of the present invention will be explained below in detail with reference to the accompanying drawings.

Figure 1:
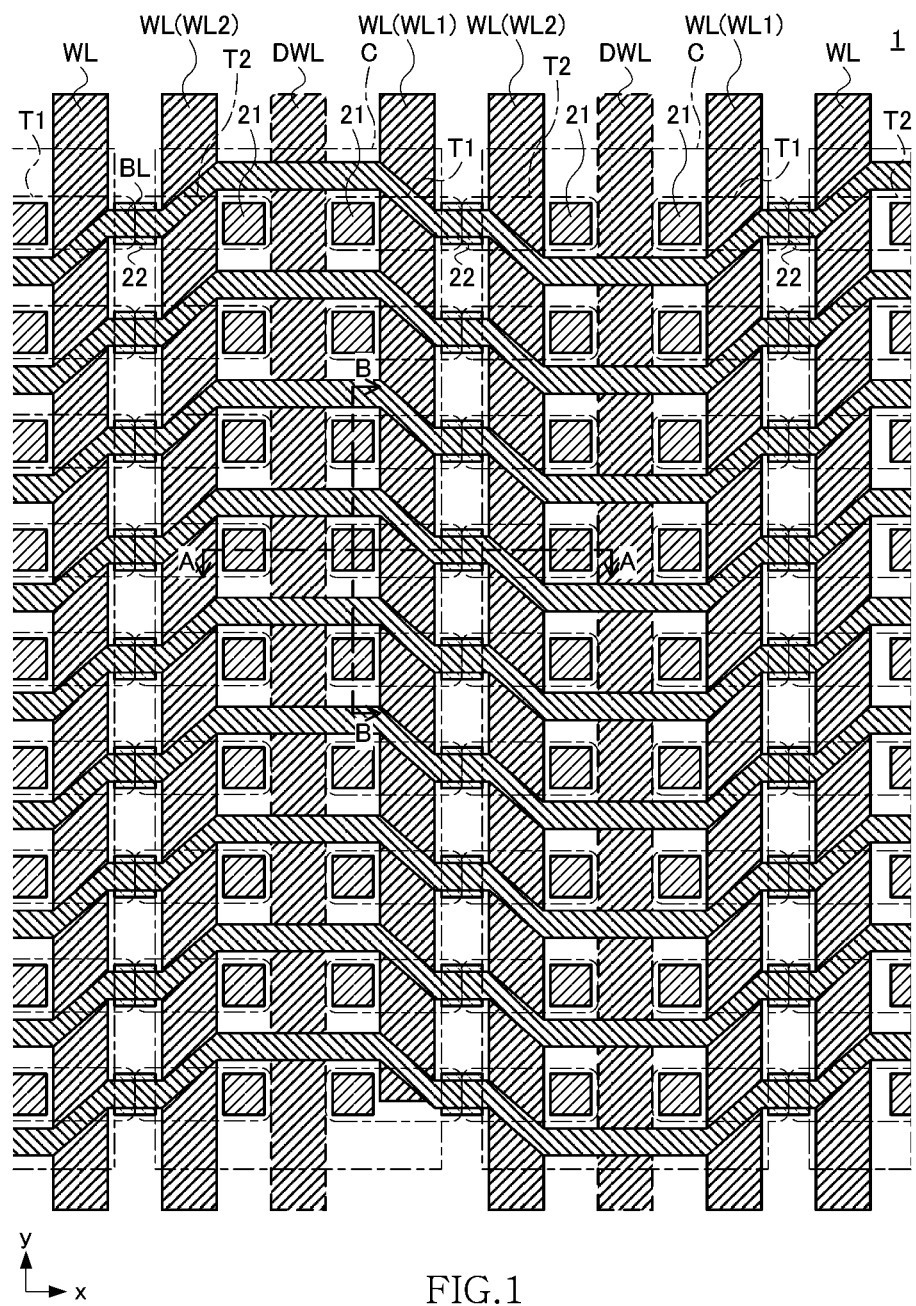
FIG. 1 is a schematic plan view of a semiconductor memory device 1 according to an embodiment of the present invention, showing various constituent elements to be described later in a transparent manner.

Referring now to FIG. 1, the semiconductor memory device 1 is a DRAM that includes memory cells each of which is configured to include a cell transistor and a cell capacitor. FIG. 1 is a schematic plan view showing a part of a memory cell area. As shown in FIG. 1, the semiconductor memory device 1 includes a plurality of word lines WL extending in a y-direction (a word line direction) and a plurality of bit lines BL extending in an x-direction (a bit line direction). The word lines WL are arranged at regular intervals and are dummy word lines DWL every third line. Each of the bit lines BL extends in the x-direction as a whole while meandering so as to avoid capacitor contact plugs 21 to be described later. Similarly to the word lines WL, respective bit lines BL are arranged at regular intervals. Memory cells are provided to correspond to intersections between the word lines WL and the bit lines BL, respectively.

Figure 2:
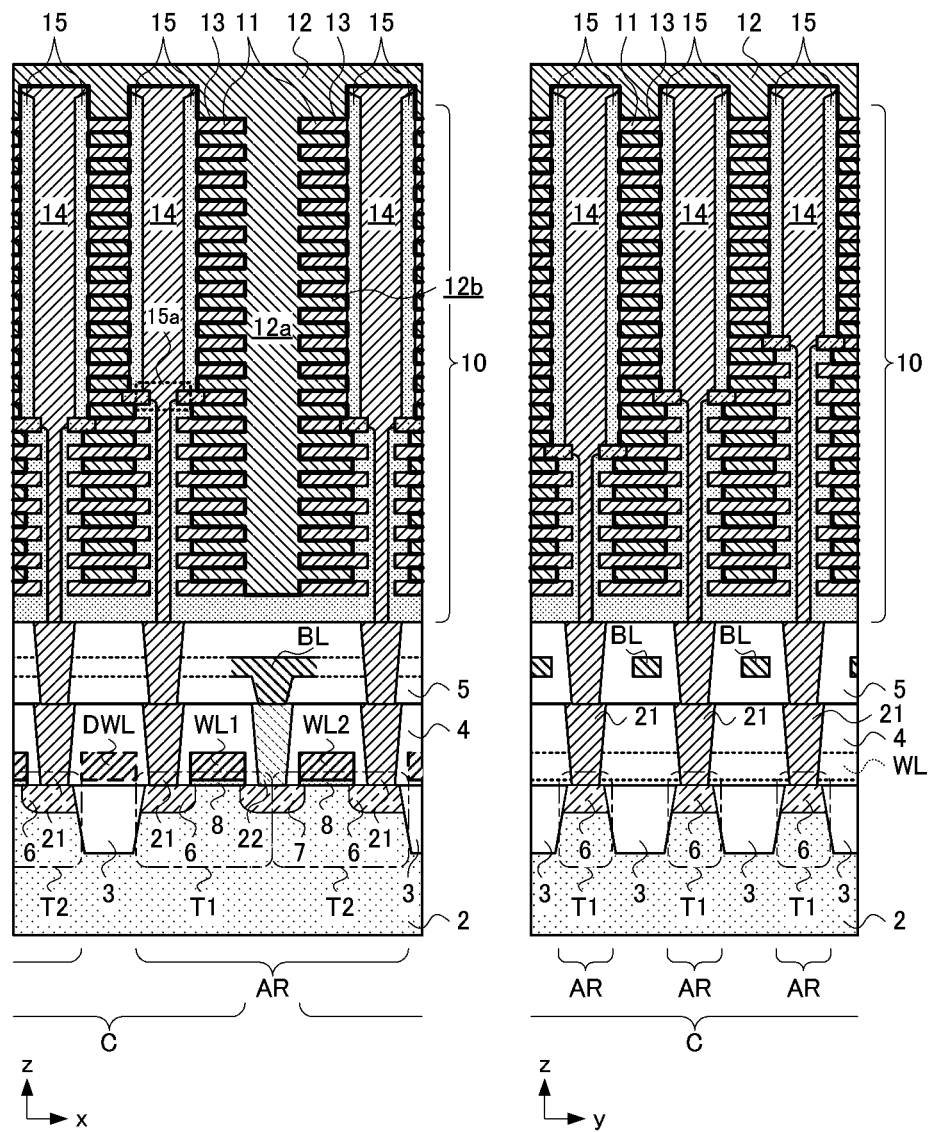
FIGS. 2A and 2B are schematic cross-sectional views of the semiconductor memory device 1, which correspond to a line A-A and a line B-B shown in FIG. 1, respectively.

As shown in FIGS. 2A and 2B, the semiconductor memory device 1 includes a silicon substrate (semiconductor substrate) 2, and element isolation regions (Shallow Trench Isolation) 3 are provided on a surface of the silicon substrate 2. The element isolation regions 3 are constituted by a silicon oxide film buried in the surface of the silicon substrate 2, thereby laying out a matrix of active regions AR on the surface of the silicon substrate 2.

Each of the active regions AR is laid out at a position at which the active region AR overlaps with two adjacent word lines WL1 and WL2 in a plan view. In each of the active regions AR, two cell transistors that use these two word lines WL1 and WL2 as gate electrodes, respectively, are arranged. In the following explanations, the transistor that uses the word line WL1 as a gate electrode is referred to as "first cell transistor T1", and the transistor that uses the word line WL2 as a gate electrode is referred to as "second cell transistor T2". As shown in FIG. 1, lines of a plurality of first cell transistors T1 and lines of a plurality of second cell transistors T2 are arranged along the y-direction on the surface of the silicon substrate 2, respectively. The lines of the first cell transistors T1 and the lines of the second cell transistors T2 are alternately arranged in the x-direction.

As shown in FIG. 2A, the word lines WL1 and WL2 are arranged in portions slightly upper than the silicon substrate 2. A gate insulating film 8 is arranged between each of the word lines WL1 and WL2 and the surface of the silicon substrate 2. As a material constituting the word lines WL, polysilicon or a metallic material such as tungsten is preferable. As a material constituting the gate insulating film 8, polysilicon oxide is preferable.

Within each of the active areas AR on the surface of the silicon substrate 2, impurity diffusion layers 6 are formed in regions corresponding to the both sides of the word lines WL1 and WL2, and an impurity diffusion layer 7 is formed in a region corresponding to a region between the word lines WL1 and WL2. These impurity diffusion layers 6 and 7 are formed by implanting impurity ions that are opposite in a conduction type to impurities contained in the silicon substrate 2 into the surface of the silicon substrate 2. One of the impurity diffusion layers 6 and 7 located on the both sides of the word line WL1 respectively serves as one of a source and a drain of the first cell transistor T1 and the other of them serves as the other of the source and the drain. One of the impurity diffusion layers 6 and 7 located on the both sides of the word line WL2 respectively serves as one of a source and a drain of the second cell transistor T2 and the other of them serves as the other of the source and the drain.

With the configuration described above, when the word line WL1 is activated, for example, a channel is generated on the surface of the silicon substrate 2 located between the impurity diffusion layers 6 and 7 present on the respective both sides of the word line WL1, and then the first cell transistor T1 is turned on. The same holds true for the word line WL2. Accordingly, the bit line BL is connected to the cell capacitor in response to the activation of the word line WL.

As shown in FIGS. 2A and 2B, the entire surface of the silicon substrate 2 is covered with interlayer insulating films 4 and 5. Specifically, the interlayer insulating films 4 and 5 are preferably silicon oxide films. The interlayer insulating film 4 is formed to have a thickness enough to cover an upper surface of the word line WL. The interlayer insulating film 5 is formed on an upper surface of the interlayer insulating film 4, and the bit line BL is provided within the interlayer insulating film 5.

The capacitor contact plugs 21 for drawing out the impurity diffusion layers 6 to an upper layer and bit-line contact plugs 22 for electrically connecting the impurity diffusion layers 7 to the bit lines BL within the interlayer insulating film 5 are provided in the interlayer insulating films 4 and 5. Each of the contact plugs 21 and 22 is formed by providing a through hole in the interlayer insulating films 4 and 5 and burying a conductive material such as polysilicon or metal such as tungsten in the through hole.

DRAM cell capacitors are formed on an upper surface of the interlayer insulating film 5. While the cell capacitors are provided with respect to each of the cell transistors, the cell capacitors are not provided in a region just above the corresponding cell transistor but provided to spread into a region overlapping with each region C shown in FIG. 1 in a plan view. A configuration of the cell capacitor in the semiconductor memory device 1 is described below in detail.

First, an electrical connection relation is explained. The region C shown in FIG. 1 is a region laid out on a surface of the silicon substrate 2. As shown in FIG. 1, two word lines WL1 and WL2 adjacent to each other across the dummy word line DWL and nine bit lines BL-1 to BL-9 pass through each of the region C.

Figure 3:
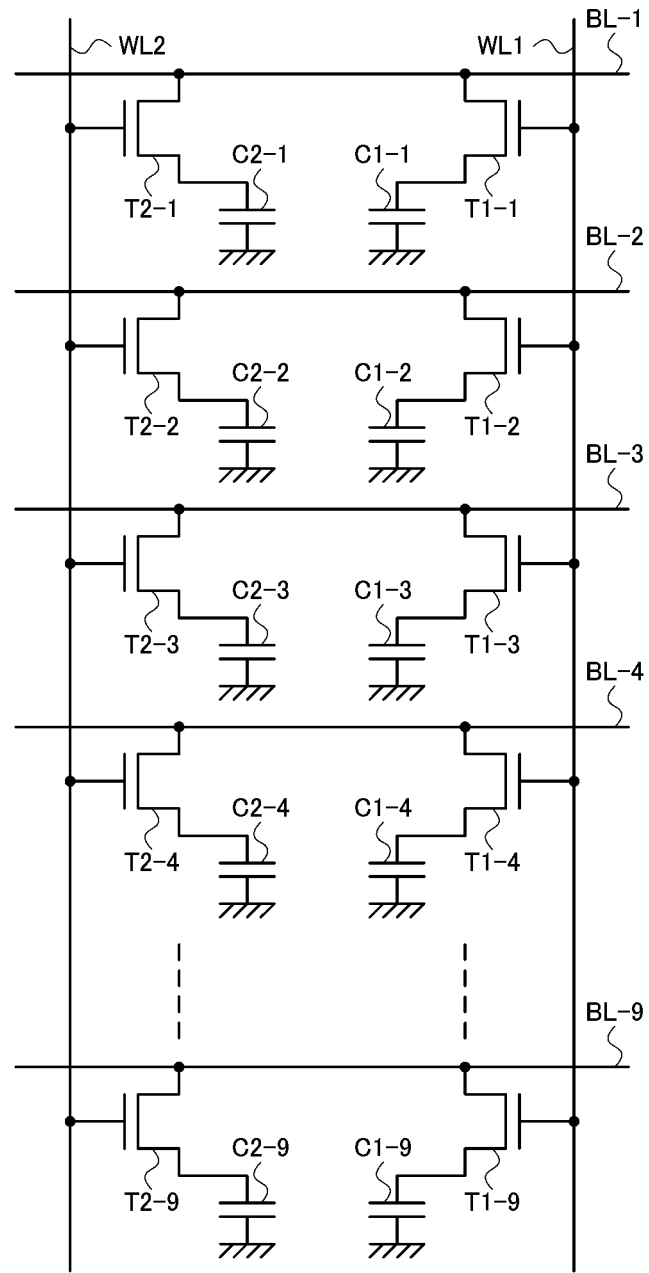
FIG. 3 is a circuit diagram showing an electrical connection relation between cell transistors in the region C shown in FIG. 1 and cell capacitors corresponding to these cell transistors.

As shown in FIG. 3, a cell transistor T1-$n$ is arranged at an intersection between the word line WL1 and a bit line BL-n (n is an integer from 1 to 9). A control terminal (a gate) of the cell transistor T1-$n$ is connected to the word line WL1 and one of controlled terminals (one of a source and a drain) of the cell transistor T1-$n$ is connected to the bit line BL-n. In addition, the other controlled terminal (the other one of the source and the drain) of the cell transistor T1-$n$ is connected to a power supply wire to which a ground potential is supplied via a cell capacitor C1-$n$.

Similarly, a cell transistor T2-$n$ is arranged at an intersection between the word line WL2 and the bit line BL-n. A control terminal of the cell transistor T2-$n$ is connected to the word line WL2 and one of controlled terminals of the cell transistor T2-$n$ is connected to the bit line BL-n. In addition, the other controlled terminal of the cell transistor T2-$n$ is connected to a power supply wire to which a ground potential is supplied via a cell capacitor C2-$n$.

As described above, in the present embodiment, the region C includes 9×2=18 cell transistors. While the semiconductor memory device 1 is described below on the premise that there are 18 cell transistors in the region C, in the present invention, the number of cell transistors to be included in the region C is not limited to 18, and it suffices that the region C includes two or more cell transistors.

Figure 4:
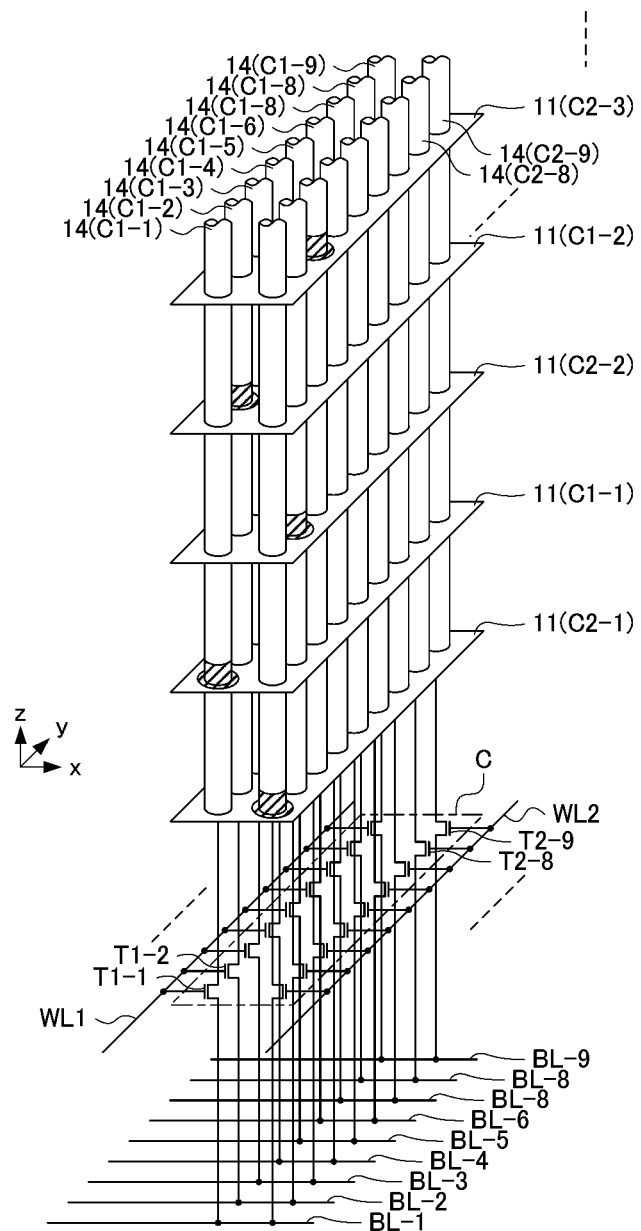
FIG. 4 is a three-dimensional structure diagram for schematically showing lower electrodes 11 of respective cell capacitors.

Turing to FIG. 4, in the semiconductor memory device 1, the lower electrodes 11 (lower electrode layers) of 18 cell capacitors C1-1 to C1-9 and C2-1 to C2-9 are stacked in a z-direction (a normal direction of the silicon substrate 2). The lower electrodes 11 of the cell capacitors C2-1, C1-1, C2-2, C1-2, C2-3, . . . , C2-9, and C1-9 are stacked in this order that is a stacking order from the bottom. Note that FIG. 4 shows only 5 lower electrodes 11 from the bottom out of the 18 lower electrodes 11, and does not show other lower electrodes 11. An outer periphery of each of the lower electrodes 11 matches that of the region C in a plan view.

The semiconductor memory device 1 also includes contact plugs 14 for each of cell capacitors. Each of the contact plugs 14 extends in the z-direction so as to penetrate the 18 stacked lower electrodes 11.

Shaded portions of the contact plugs 14 and the lower electrodes 11 shown in FIG. 4 indicate portions in which the contact plugs 14 are electrically connected to the lower electrodes 11, respectively. As can be understood from the shaded portions, each of the contact plugs 14 is electrically connected only to the lower electrode 11 of the corresponding capacitor among the 18 lower electrodes 11. For example, the contact plug 14 corresponding to the cell capacitor C1-1 is electrically connected only to the lower electrode 11 (the second lower electrode 11 from the bottom) corresponding to the cell capacitor C1-1 and not to other lower electrodes 11. Similarly, the contact plug 14 corresponding to the cell capacitor C2-1 is electrically connected only to the lower electrode 11 (the lowermost lower electrode 11) corresponding to the cell capacitor C2-1 and not to other lower electrodes 11.

A lower end of each of the contact plugs 14 is electrically connected to the other controlled terminal of a cell transistor corresponding to a cell capacitor corresponding to the contact plug 14. Specifically, the contact plug 14 corresponding to the cell capacitor C1-$n$ is electrically connected to the other controlled terminal of the cell transistor T1-$n$. Similarly, the contact plug 14 corresponding to the cell capacitor C2-$n$ is electrically connected to the other controlled terminal of the cell transistor T2-$n$.

As described above, the contact plug 14 provided to penetrate the lower electrodes 11 connects the other controlled terminal of each of cell transistors to the lower electrode 11 of a corresponding cell capacitor.

Referring back to FIGS. 2A and 2B, as shown in these drawings, in the semiconductor memory device 1, a stacked structure 10 is provided on the upper surface of the interlayer insulating film 5. The stacked structure 10 is configured to include an upper electrode 12 and capacitor insulating films 13 of cell capacitors, as well as the lower electrodes 11 and the contact plugs 14 described above.

The upper electrode 12 is provided commonly to all the lower electrodes 11 in the memory cell area. Specifically, the upper electrode 12 includes a perpendicular portion 12$a$ extending in the z-direction and a plurality of horizontal portion 12$b$ extending in parallel to a surface of the silicon substrate 2. As shown in FIG. 2A, the lower electrodes 11 and the horizontal portions 12$b$ are alternately stacked in the z-direction. The perpendicular portion 12$a$ is provided in a region between the adjacent regions C, and functions to electrically connect the horizontal portions 12$b$ and to isolate the lower electrodes 11 in one region C from those in the other region C.

The capacitor insulating films 13 are provided between the upper electrode 12 and each of the lower electrodes 11 and between upper ends of the contact plugs 14 and the upper electrode 12, respectively. By providing the capacitor insulating films 13 in this manner, the lower electrodes 11 are isolated from one another, the upper electrode 12 faces each of the lower electrodes 11 across the capacitor insulating films 13, respectively, and cell capacitors are constituted between the upper electrode 12 and the lower electrodes 11. That is, a plurality of (18 in this example) cell capacitors are formed in the regions overlapping with one another in a plan view within the region C. As obvious from FIGS. 2A and 2B, a facing direction in which the upper electrode 12 faces the lower electrodes 11 in the cell capacitors according to the present embodiment is mainly the perpendicular direction.

As shown in FIGS. 2A and 2B, the lower end of each of the contact plugs 14 comes in contact with an upper end of the capacity contact plug 21. This configuration can establish an electrical connection between the other controlled terminal of each of cell transistors and each of the contact plugs 14 as described with reference to FIG. 4.

Furthermore, an insulating film 15 including an opening 15$a$ is provided on a side surface of each of the contact plugs 14. The insulating film 15 ensures insulating the contact plug 14 from each of the lower electrodes 11 and the upper electrode 12, and the opening 15$a$ of the insulating film 15 establishes an electrical connection of each of the contact plugs 14 to the lower electrode 11. The opening 15$a$ is provided at a position of the lower electrode 11 of the cell capacitor corresponding to the contact plug 14. Therefore, the opening 15$a$ can establish the connection of each of the contact plugs 14 to the lower electrode 11 (each of the contact plugs 14 is electrically connected only to the lower electrode 11 of a corresponding cell capacitor and not to other lower electrodes 11) as described with reference to FIG. 4.

As described above, in the semiconductor memory device 1, a plurality of cell capacitors are formed in the regions overlapping with the region C in a plan view while overlapping with one another. Therefore, an allocatable area (an area in an xy plane allocatable to one cell capacitor) increases to the same extent as an area of the region C in the xy plane. Accordingly, in the semiconductor memory device that adopts a stacked structure of the cell transistors and the cell capacitors, it is possible to make the allocatable area larger than a cell area (an area of one cell transistor in the xy plane). Therefore, it is possible to give a margin to the capacity of each cell capacitor while keeping advantages of the stacked structure in that the total area of the memory cell area can be reduced.

Furthermore, in the semiconductor memory device 1, the thicknesses of the electrodes (the thicknesses in a facing direction in which the upper electrode faces the lower electrodes) required to be equal to or larger than a certain value so as to ensure necessary characteristics are those in a perpendicular direction, and are not restricted by the cell area. Therefore, it is possible to ensure the necessary characteristics more easily than conventional vertical transistors even if downsizing of cell transistors is further developed.

A method of manufacturing the semiconductor memory device 1 according to the present embodiment is explained next with reference to FIG. 5 to FIG. 20.

Figure 5A:
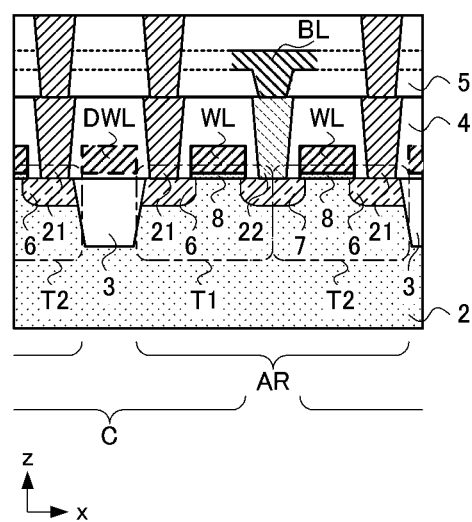
Figure 5B:
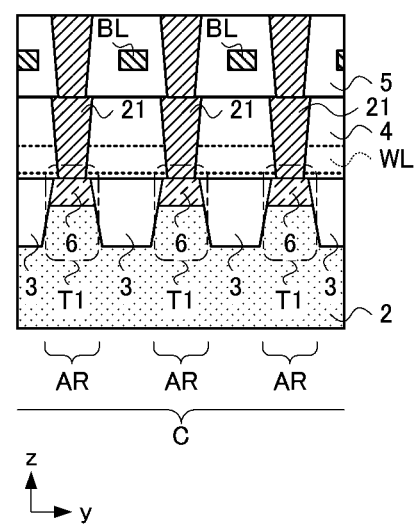

First, as shown in FIGS. 5A and 5B, the silicon substrate 2 is prepared. A cell transistor layer including the cell transistors T1 and T2, the capacitor contact plugs 21, the bit-line contact plugs 22, the word lines WL, the bit lines BL and the like is then formed on the surface of the silicon substrate 2. As a specific method of forming the cell transistor layer, a conventional DRAM manufacturing method can be used. While planar MOS transistors are used as the cell transistors T1 and T2 in this example, vertical transistors using a silicon pillar or other types of transistors, such as MIS (Metal Insulator Semiconductor) transistors or bipolar transistors, can be also used. The conduction type (such as P-channel MOS or N-channel MOS) of the cell transistors T1 and T2 is not limited to any specific type.

Figures 6A, 6B:
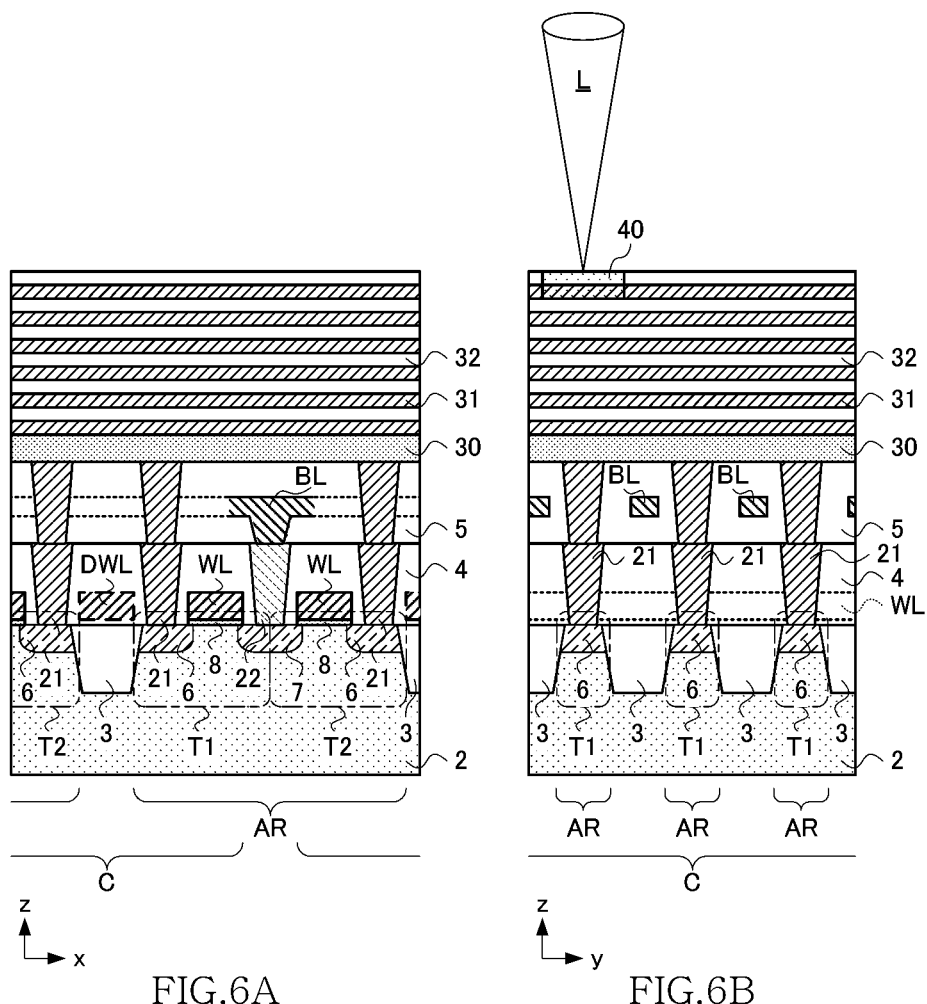
Figures 7A, 7B:
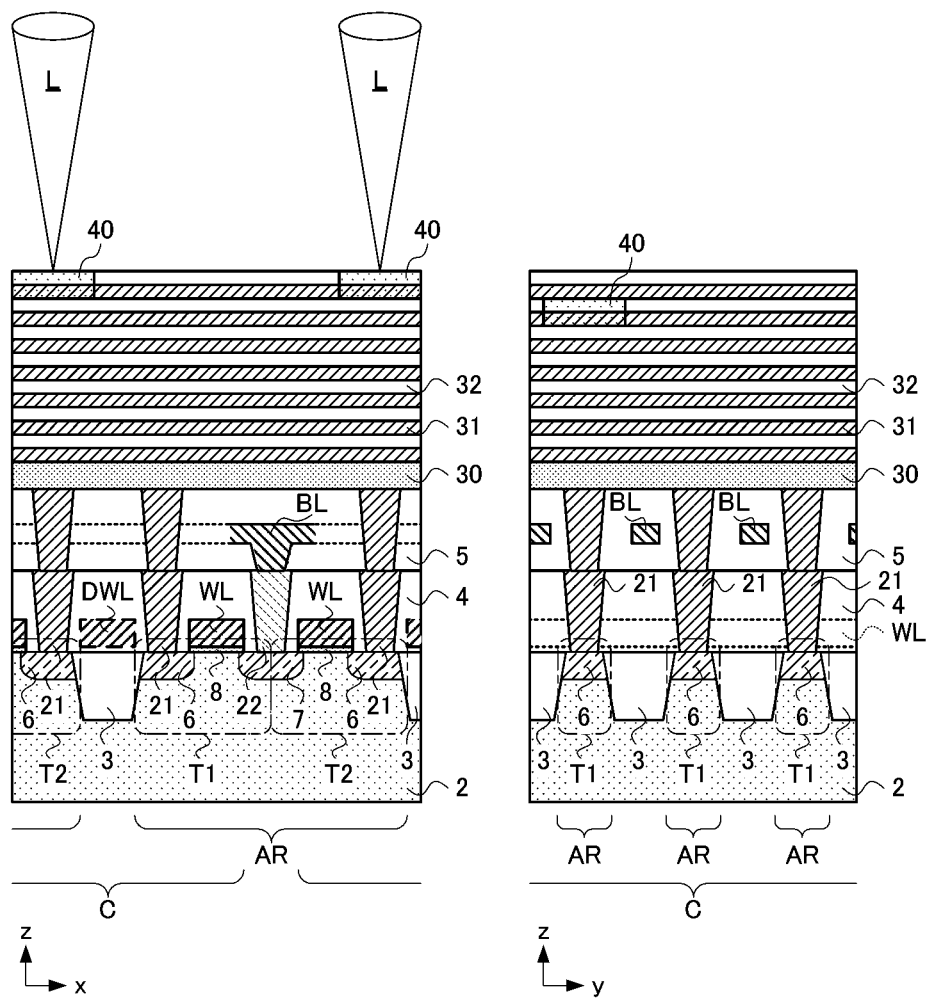
Figures 8A, 8B:
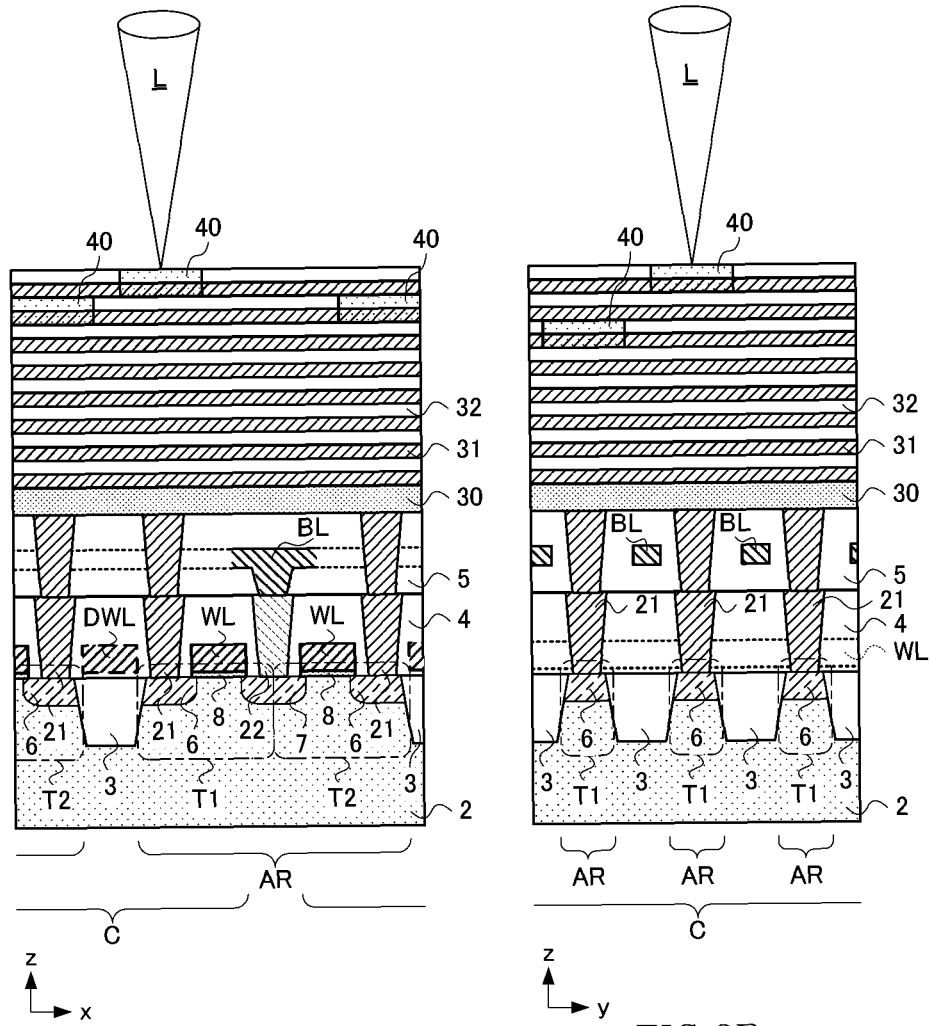
Figure 9A:
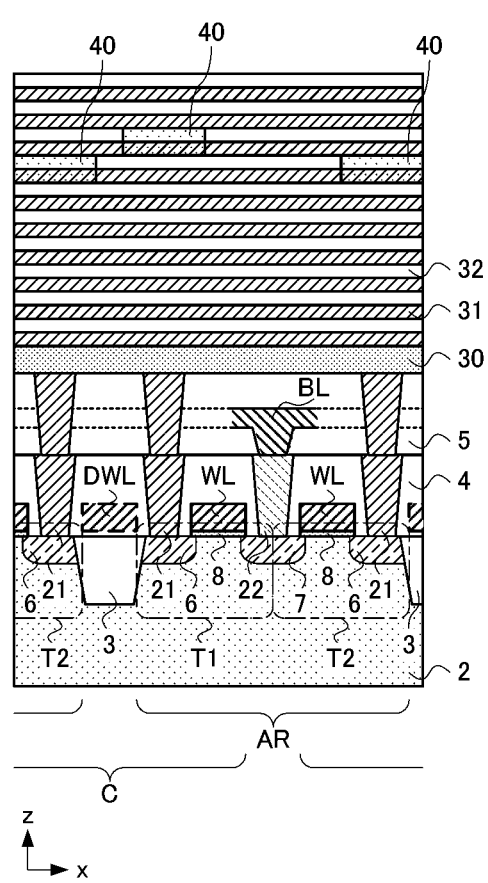
Figure 9B:
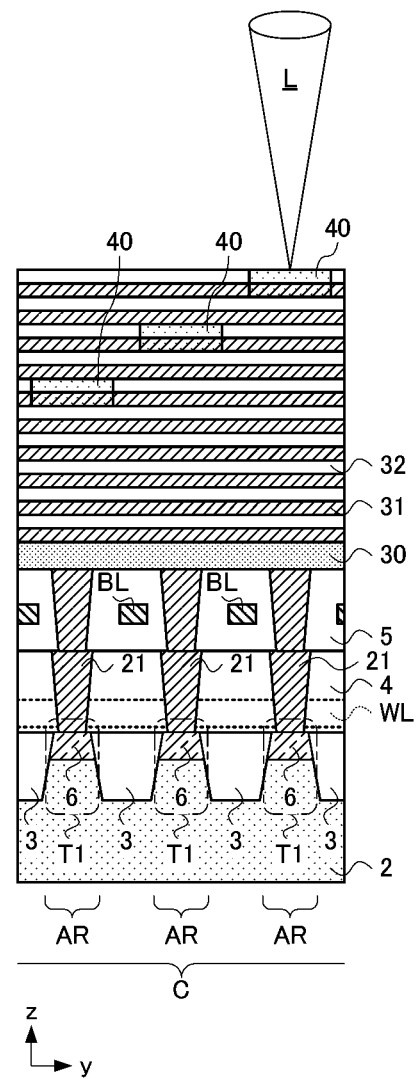
Figures 10A, 10B:
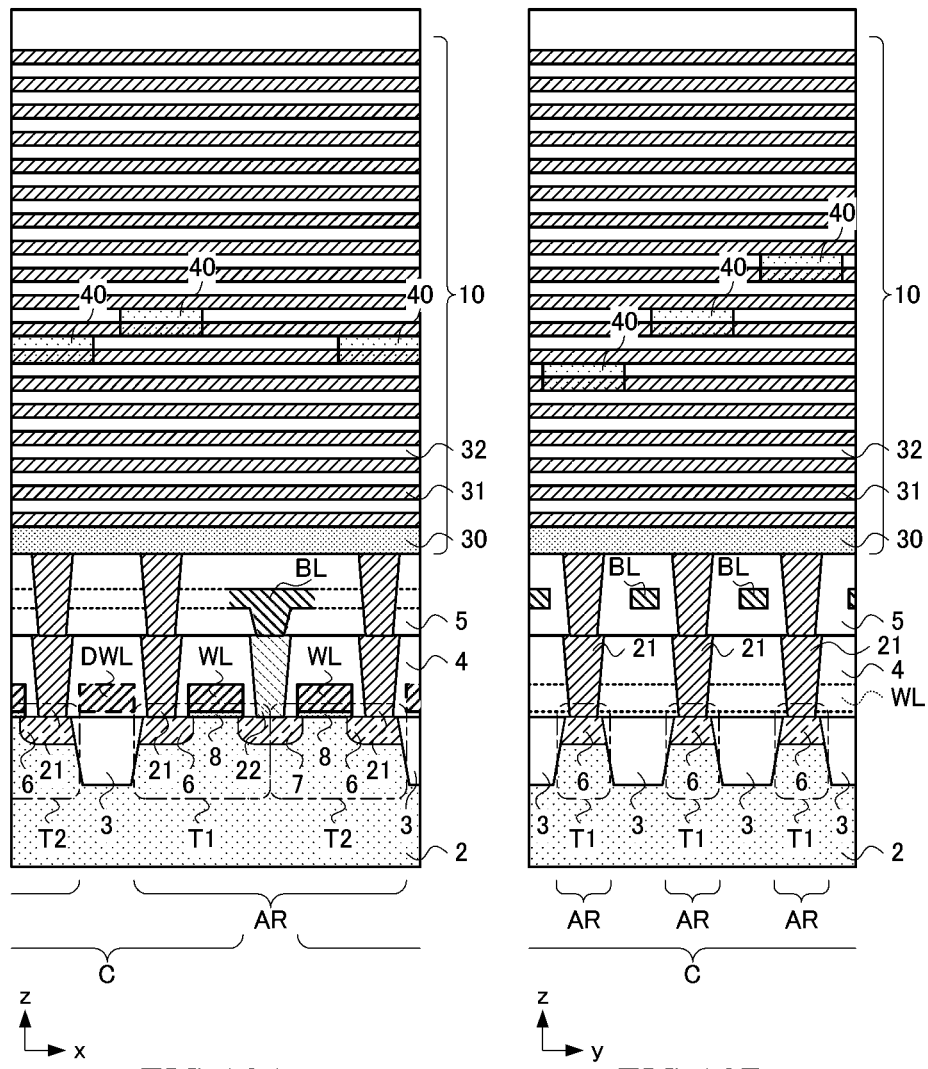

As shown in FIGS. 6A and 6B, an insulating film 30 made of silicon nitride is formed on the upper surface of the interlayer insulating film 5. And, on the insulating film 30, as shown in FIGS. 6A to 10B, conductive films 31 that are to serve as the lower electrodes 11 and insulating films 32 (insulating layers) made of silicon oxide are alternately stacked, thereby forming the stacked structure 10 shown in FIGS. 10A and 10B. As for the thicknesses of the layers, it is normally preferable that the conductive film 31 has a thickness of about 10 nm and that the insulating film 32 has a thickness of 20 nm. However, these values are appropriately adjusted depending on the characteristics required for cell capacitors. Nevertheless, the uppermost insulating film 32 is preferably thicker than other insulating films 32 or, to be specific, about 50 nm thick, as shown in FIGS. 10A and 10B, because the uppermost insulating film 32 serves as a protection film during processing.

While stacking the conductive films 31 and the insulating films 32, a laser beam is irradiated onto a portion of the insulating film 32 that contacts an upper surface of the conductive film 31 that is to serve as the corresponding lower electrode 11 for each of cell transistors in a plan view, which portion is formed in the region overlapping with the cell transistor, as shown in FIGS. 6B, 7A, 8A, 8B, and 9B. As a result, the insulating films 32 in the regions irradiated with a laser beam are locally densified. Furthermore, the state of the conductive film 31 located just under each densified insulating film 32 is altered from an amorphous state to a crystal state. In the following explanations, the insulating films 32 and the conductive films 31 which are altered are collectively referred to as "altered layers 40".

Next, a plurality of first through holes 33 (FIGS. 13A and 13B) to bottoms of which the cell transistors are electrically exposed are formed to correspond to the cell transistors, respectively. A method of forming the first through holes 33 is described below with reference to FIGS. 11A to 13B.

Figures 11A, 11B:
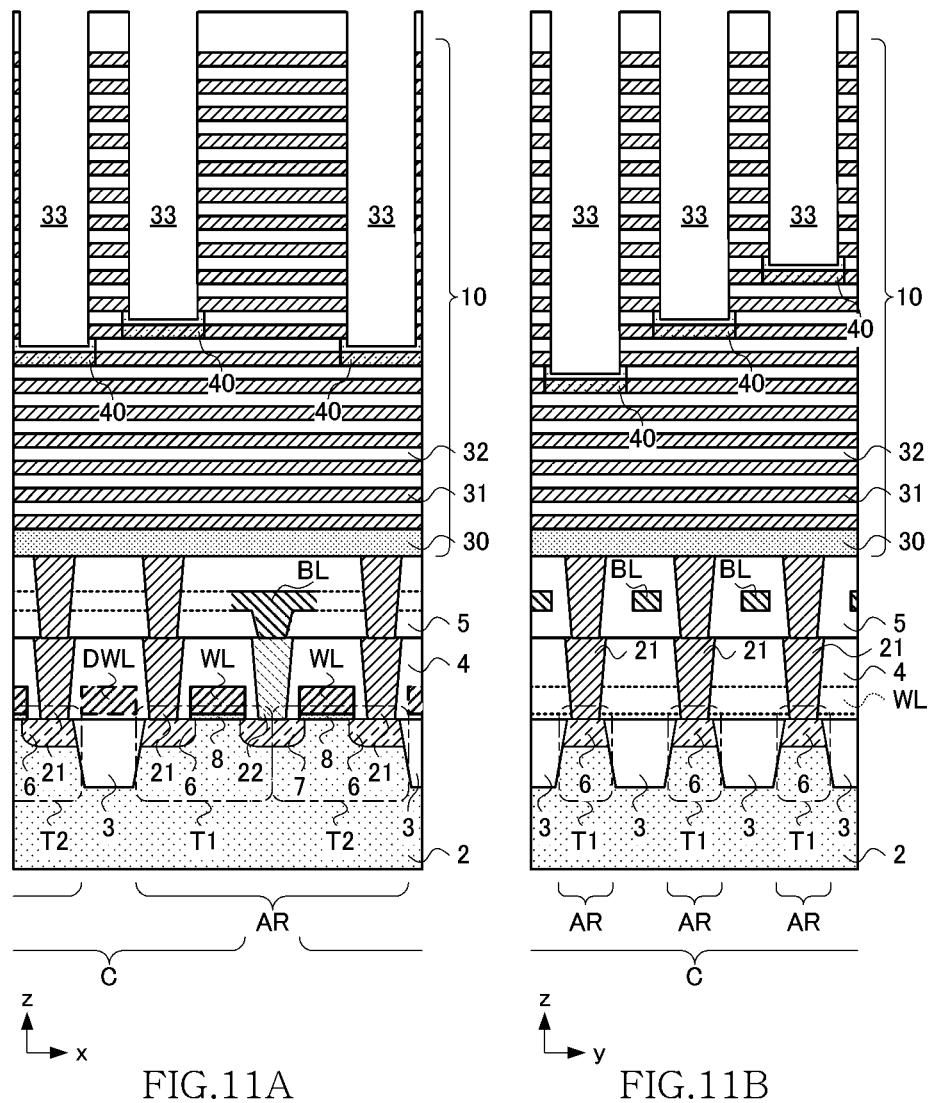

First, the stacked structure 10 is etched from an upper surface to a portion that reaches each of the altered layers 40 by using a mask pattern (not shown). That is, etching is performed by using the altered layers 40 as stoppers. Such etching can be realized by performing etching such that an etching rate of etching the densified insulating films 32 or the conductive films 31 in a crystal state is lower than that of etching other portions. By this etching, as shown in FIGS. 11A and 11B, upper portions of the first through holes 33 (portions upper than the openings 15a to be formed later) are formed.

Figures 12A, 12B:
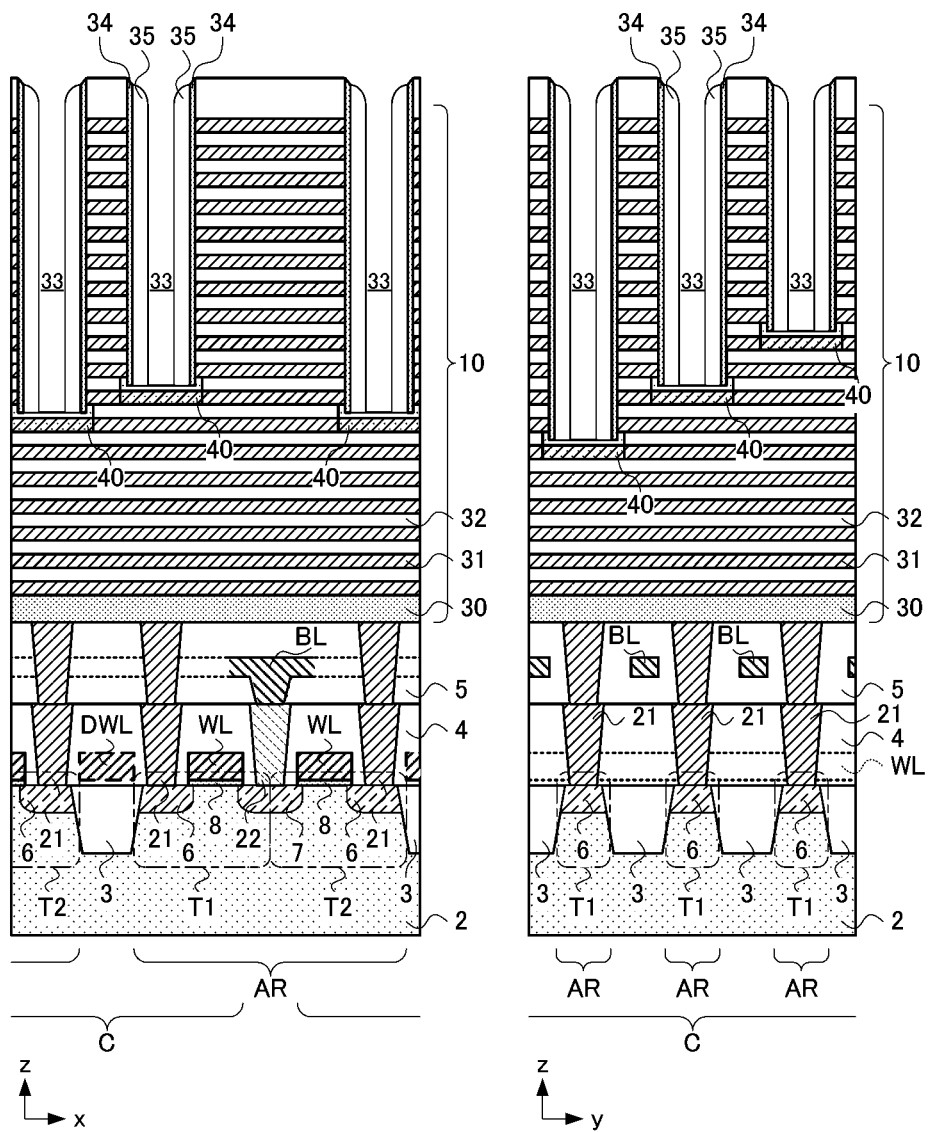

Next, a silicon nitride film is formed on the entire surface of the silicon substrate 2 and etched back. As shown in FIGS. 12A and 12B, a sidewall insulating film 34 made of silicon nitride is thereby formed on an inner wall of each of the first through holes 33. Furthermore, a silicon sidewall oxide film is formed on the entire surface of the silicon substrate 2 and etched back. In this manner, as shown in FIGS. 12A and 12B, a sidewall insulating film 35 made of silicon oxide is further formed on the inside of the sidewall insulating film 35.

Figures 13A, 13B:
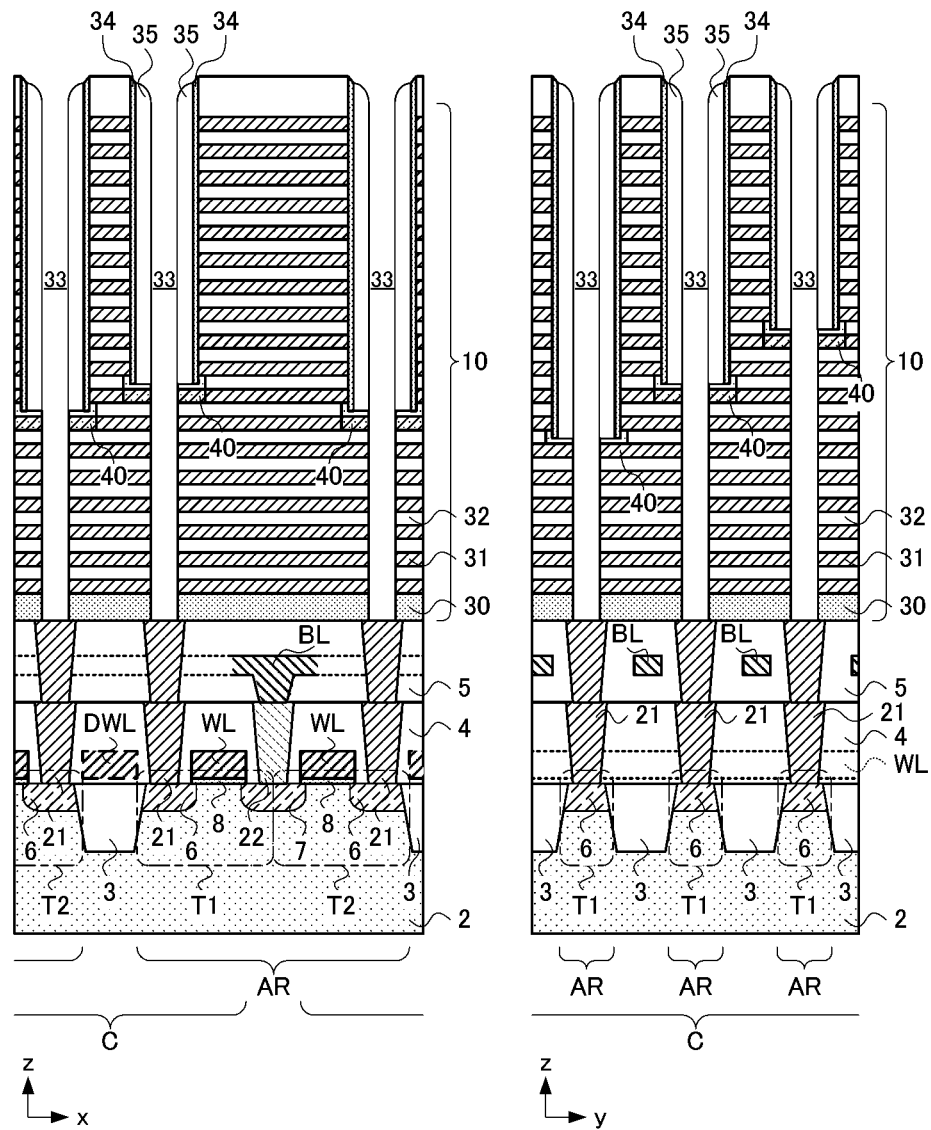

Thereafter, anisotropic etching is performed by using the sidewall insulating films 34 and 35 as a mask. As shown in FIGS. 13A and 13B, remaining portions (lower portions) of the first through holes 33 are thereby formed. Upper surfaces of the capacitor contact plugs 21 of the corresponding cell transistors are exposed to bottoms of the first through holes 33 formed in the above manner, respectively. Therefore, the corresponding cell transistors are electrically exposed.

By forming the first through holes 33 as described above, the diameter of each of the upper portions of the respective first through holes 33 is made larger than that of each of the lower portions thereof. That is, stepped portions are formed in portions corresponding to each of the altered layers 40 on an inner wall of each of the first through holes 33.

Figures 14A, 14B:
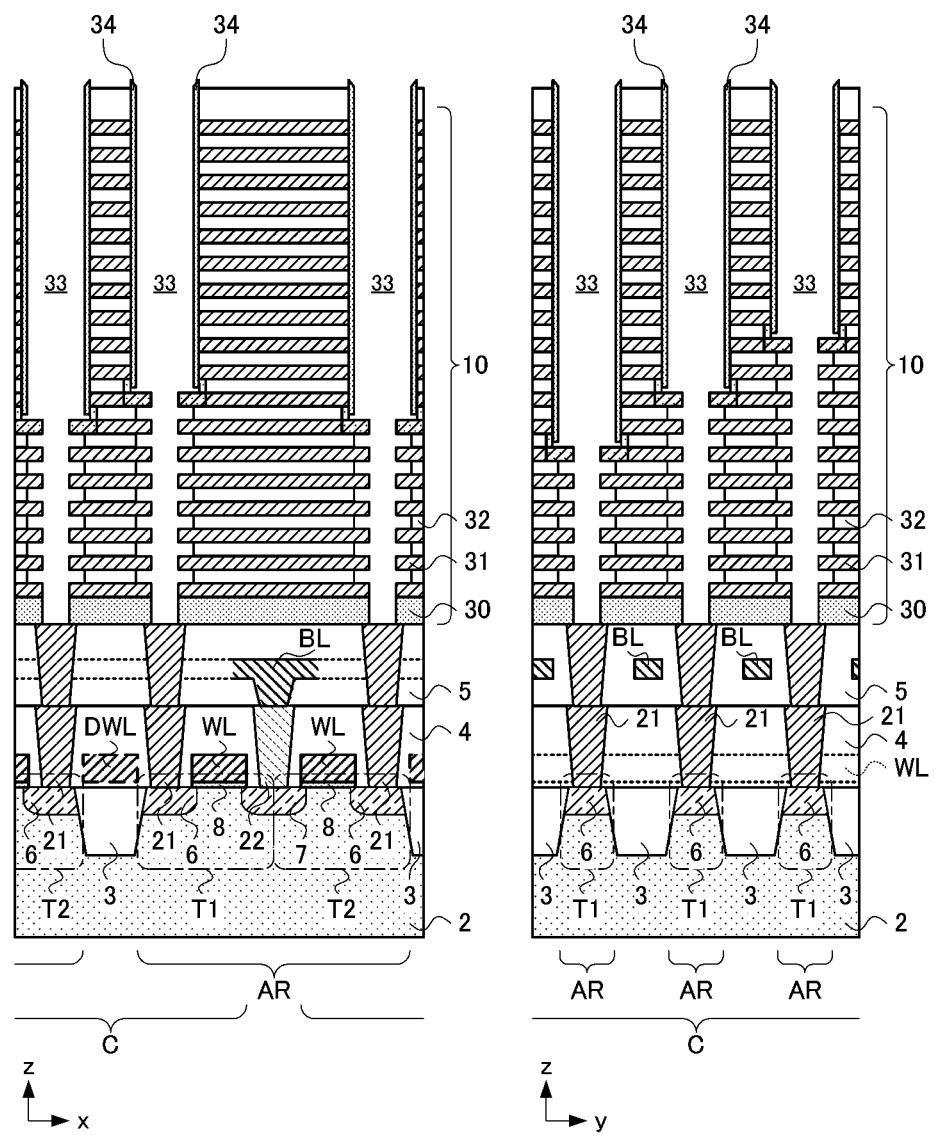
Figures 15A, 15B:
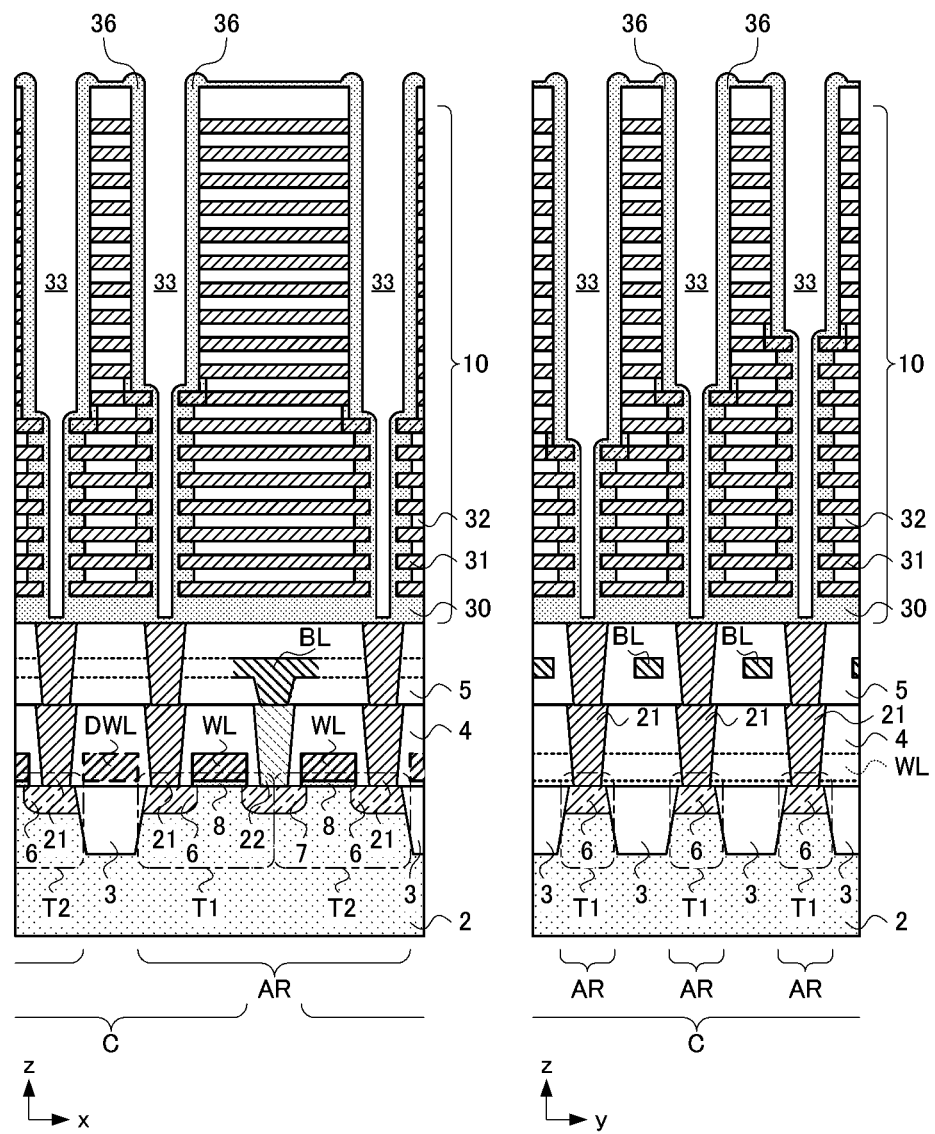

After forming the first through holes 33, isotropic wet etching is performed. As shown in FIGS. 14A and 14B, the sidewall insulating films 35 and a part of the insulating films 32 exposed to the lower portions of the first through holes 33 are thereby removed. In this case, the etching time is preferably set such that the conductive films 31 slightly protrude from exposed surfaces of the insulating films 32 as shown in FIGS. 14A and 14B. Further, by performing this step, the conductive films 31 are exposed to upper surfaces of the stepped portions described above.

Next, a silicon nitride film is formed on the entire surface of the silicon substrate 2. The silicon nitride film is formed to the extent that the entire surfaces of the inner walls of the first through holes 33 including the stepped portions are covered with a silicon nitride film 36.

Figures 16A, 16B:
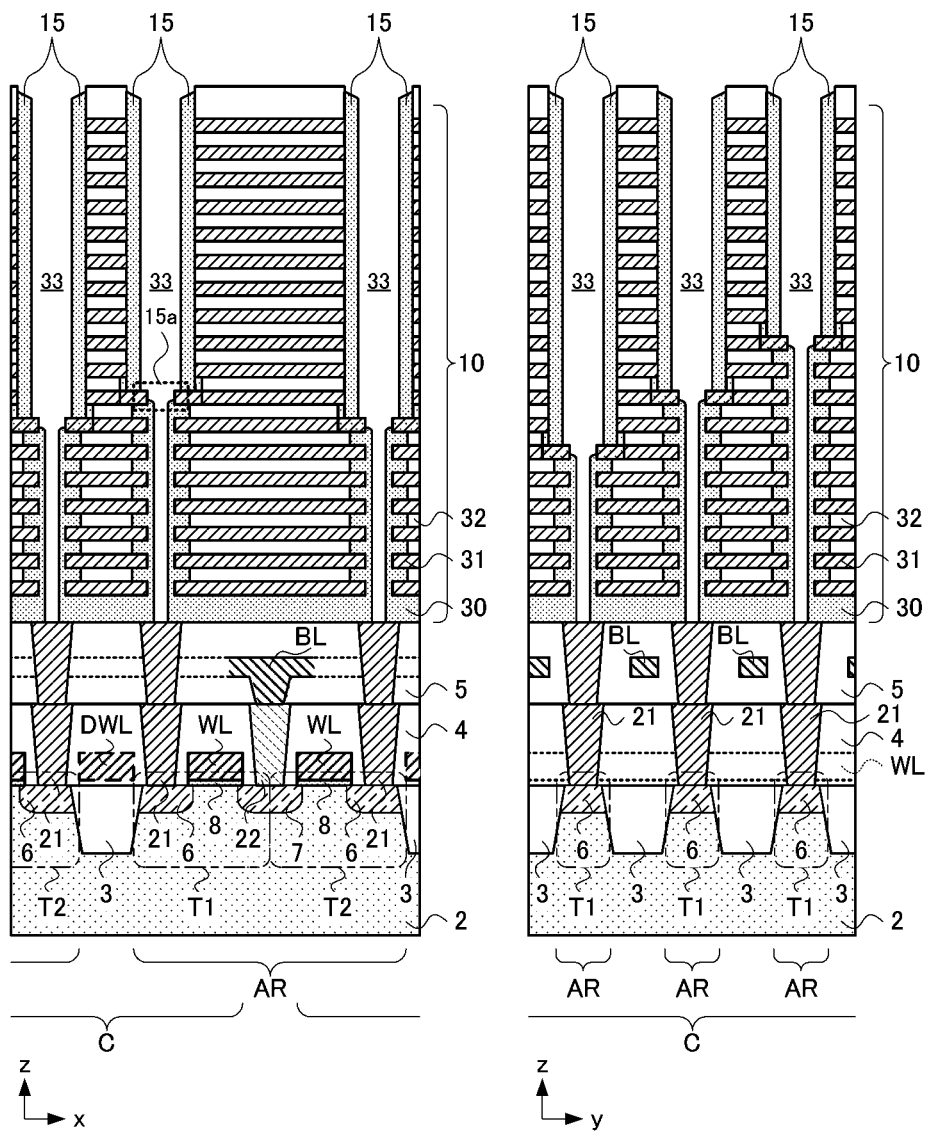

Thereafter, by performing anisotropic dry etching, the silicon nitride film 36 on a flat portion is etched aback. Remaining parts of the silicon nitride film 36 after the etching back serve as the insulating film 15. By performing this step, in the stepped portions, the opening portions 15a are formed in the insulating films 15 as shown in FIGS. 16A and 16B, and the conductive films 31 are exposed into the first through holes 33. The conductive films 31 formed on other than the stepped portions are not exposed into the first through holes 33 because the inner walls other than the stepped portions are maintained to be covered by the silicon nitride films 36. Further, the upper surfaces of the capacitor contact plugs 21 are exposed to the bottoms of the first through holes 33, respectively.

Figures 17A, 17B:
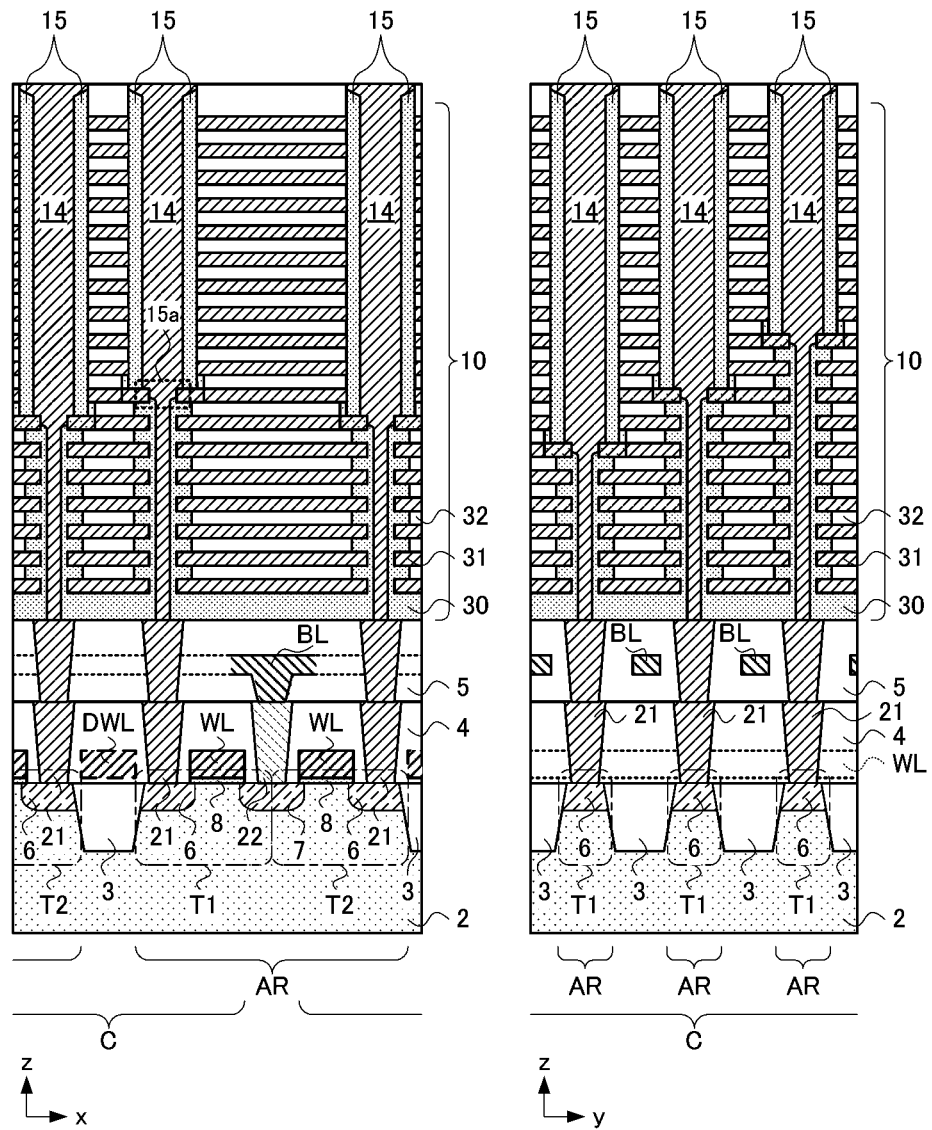

Next, a conductive material such as metal or polysilicon is buried in each of the first through holes 33. The contact plugs 14 each electrically connected to the other controlled terminal of the corresponding cell transistor are thereby formed, as shown in FIGS. 17A and 17B. The formed contact plugs 14 are also conductive to the conductive films 31 in the respective openings 15a.

Figures 18A, 18B:
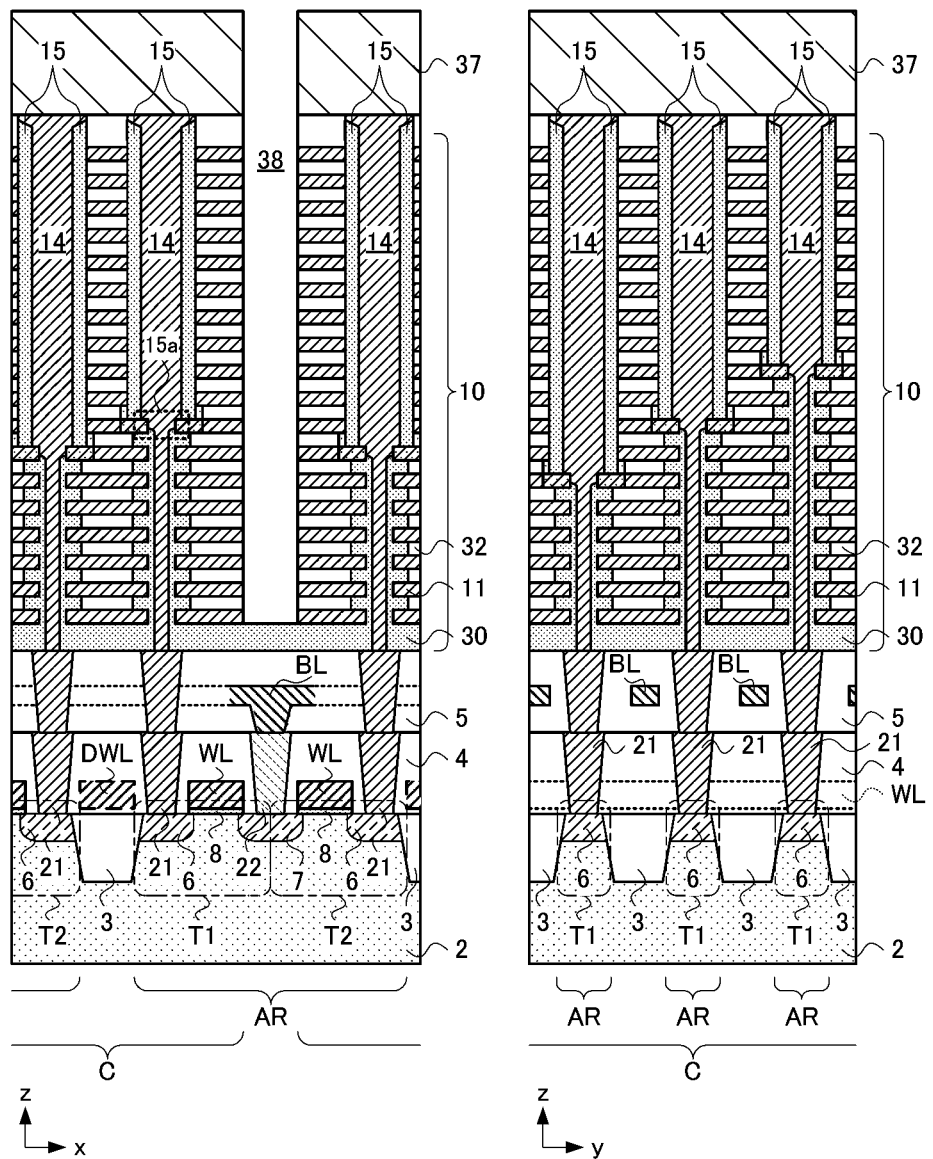

Thereafter, as shown in FIGS. 18A and 18B, patterns of the regions C are transferred onto a resist 37 by a lithography technique. Using this resist 37 as a mask, the insulating films 32 and the conductive films 31 in regions other than those overlapping with the regions C in a plan view are sequentially etched, thereby forming a second through hole 38 that penetrates the stacked structure 10 from the upper surface to the insulating film 30. By providing the second through hole 38 in this manner, the conductive films 31 are separated into portions (portions isolated from one another) in each of the region C. The separated portions respectively serve as the lower electrodes 11 described above.

Figures 19A, 19B:
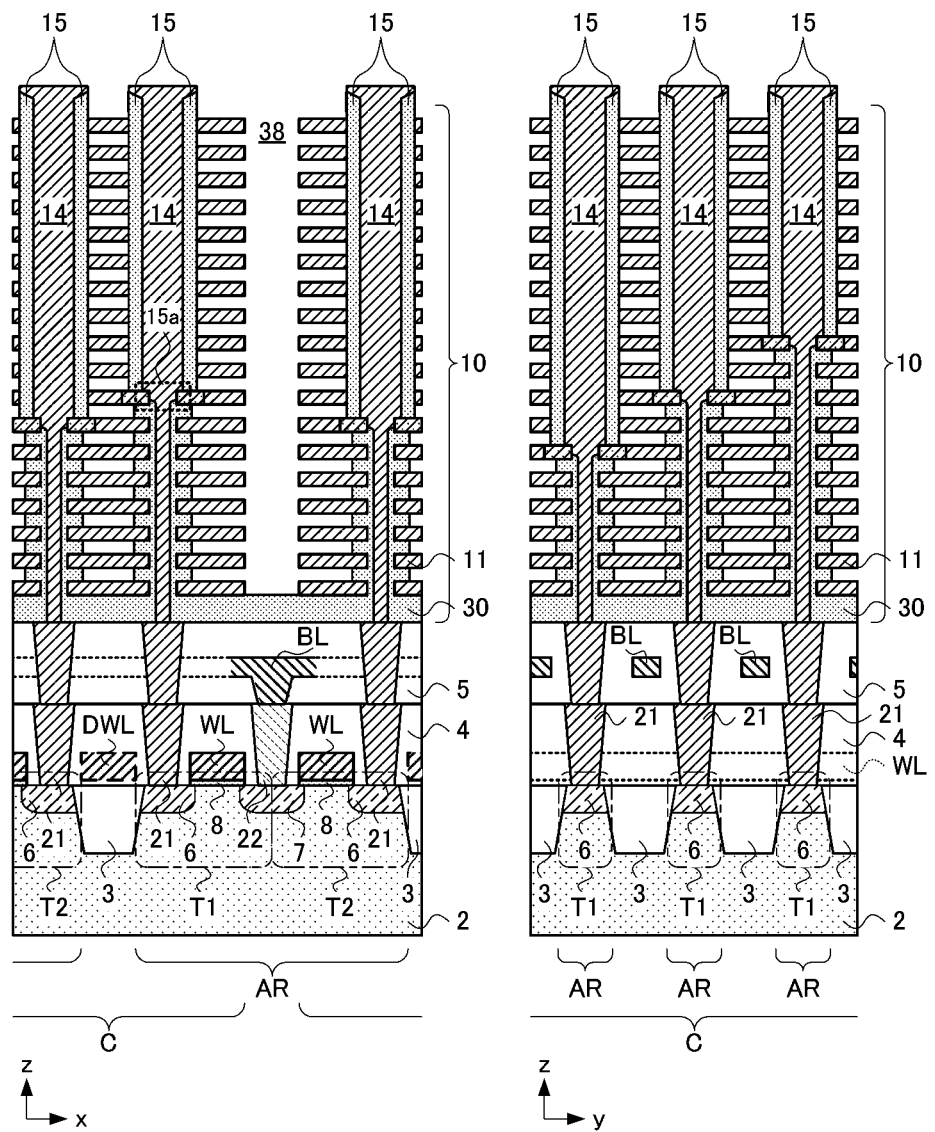

Next, by introducing an etchant via the second through hole 38, the silicon oxide films are etched. As shown in FIGS. 19A and 19B, the insulating films 32 between the lower electrodes 11 are thereby removed.

Figures 20A, 20B:
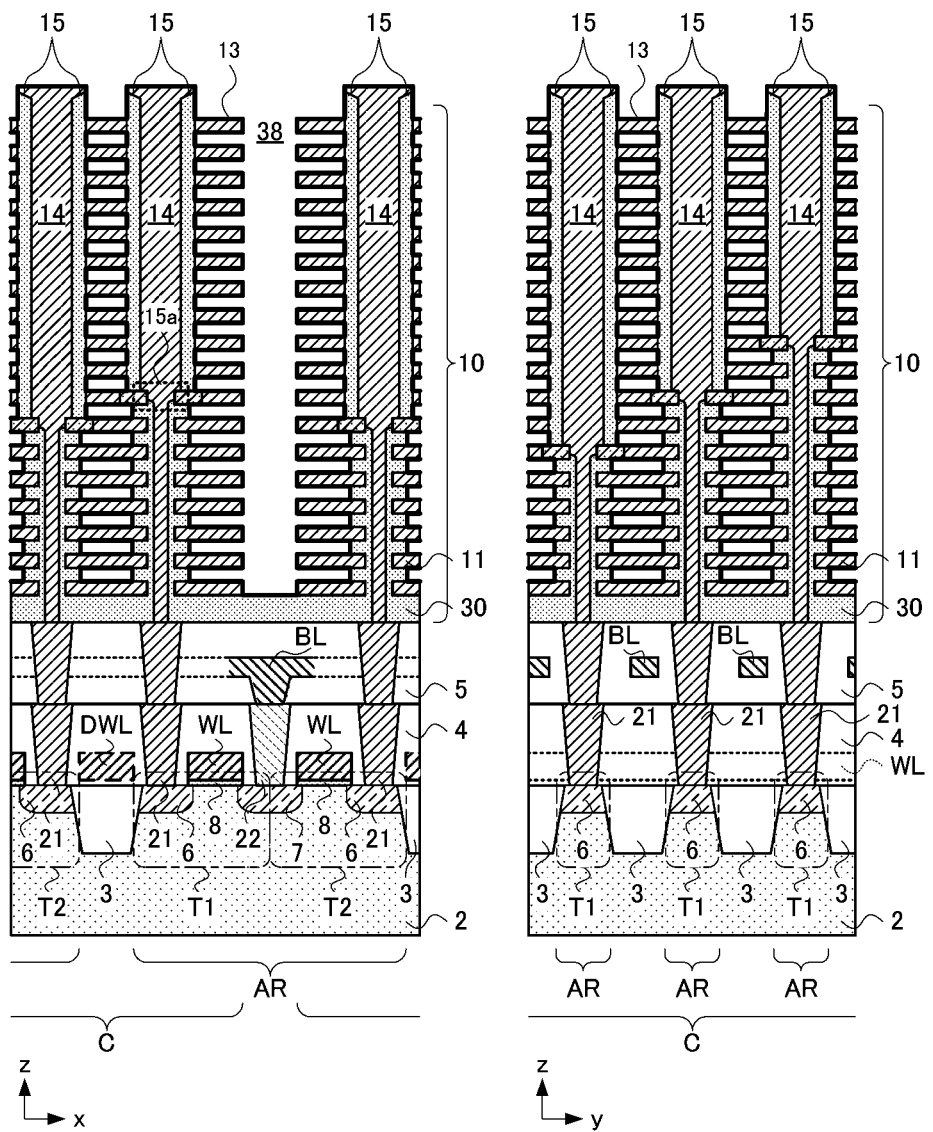

Thereafter, a silicon oxide film of about 5 nm is formed on an exposed surface including a surface of each of the lower electrodes 11. The capacitor insulating films 13 are thereby formed, as shown in FIGS. 20A and 20B. After forming the capacitor insulating films 13, a conductive material made of metal or polysilicon is formed and an upper surface of the conductive film is polished, thereby forming the upper electrode 12 shown in FIGS. 2A and 2B.

By performing the steps described above, memory cells including a cell capacitor that includes the lower electrode 11 spreading into a region overlapping with one of the regions C in a plan view are completed. Thereafter, by forming transistors and wires for peripheral circuits (not shown), a DRAM is completed as an actual product.

As described above, by the method of manufacturing the semiconductor memory device 1 according to the present embodiment, it is possible to manufacture the semiconductor memory device 1 in which a plurality of cell capacitors are formed in regions overlapping with one another in a plan view.

It is apparent that the present invention is not limited to the above embodiments, but may be modified and changed without departing from the scope and spirit of the invention.

In addition, while not specifically claimed in the claim section, the applicant reserves the right to include in the claim section of the application at any appropriate time the following methods:

A1. A manufacturing method of a semiconductor memory device, comprising:
  forming a transistor layer on a semiconductor substrate, the transistor layer including a plurality of cell transistors each having a connection node;
  forming a stacked structure on the cell transistor layer, the stacked structure having a structure in which a plurality of insulating layers and a plurality of lower electrodes are alternately stacked;
  forming a plurality of first through holes in the stacked structure, each of the first through holes exposing the connection node of an associated one of the cell transistor;
  forming sidewall insulating films on inner walls of the first through holes, each of the sidewall insulating films having an opening exposing different one of the lower electrodes from one another;
  forming contact plugs by burying conductive materials in the first through holes after forming the sidewall insulating films, each of the contact plugs connecting the connection node of an associated one of the cell transistors to an associated one of the lower electrodes;
  forming a second through hole in the stacked structure;
  removing the insulating layers by introducing an etchant via the second through hole;
  forming a capacitor insulating film on a surface of each of the lower electrodes exposed by the removing; and
  forming an upper electrode on the capacitor insulating film.

A2. The manufacturing method of a semiconductor memory device as stated in A1, wherein
  each of the first through holes includes an upper portion located above the associated one of the lower electrodes and a lower portion located below the associated one of the lower electrodes, the upper portion having greater diameter than the lower portion so that a stepped portion is formed between the upper portion and the lower portion, and
  in the forming the sidewall insulating films, the openings are formed by performing anisotropic etching to expose an upper surface of the stepped portion after forming the sidewall insulating films on the inner walls of the first through holes.

A3. The manufacturing method of a semiconductor memory device as stated in A2, wherein
  the forming the stacked structure includes irradiating a laser beam onto a portion of one of the insulating layers with respect to each of the cell transistors, the target of the irradiating being a portion formed in a region overlapping with the corresponding cell transistor in a plan view out of the insulating layer in contact with the upper surface of the corresponding lower electrode, and
  in the forming the first through holes, the upper portion is formed by performing etching with at least one of the insulating layer and the lower electrode each altered by irradiation of the laser beam used as a stopper, and the lower portion is formed by further etching a bottom of the upper portion after forming a sidewall insulating film on an inner wall of the upper portion.

A4. The manufacturing method of a semiconductor memory device as stated in any one of A1 to A3, wherein
  the lower electrodes are separated into a plurality of portions insulated from one another by the second through hole.

What is claimed is:

1. A semiconductor memory device comprising:
a semiconductor substrate having a first area;
a plurality of cell transistors arranged on the first area of the semiconductor substrate;
a plurality of cell capacitors, each of the cell capacitors including a lower electrode, an upper electrode covering the lower electrode, and a capacitor insulating film provided between the lower electrode and upper electrode, the lower electrode being electrically connected to an associated one of the cell transistors, the lower electrodes of the cell capacitors being stacked in a vertical direction so that each of the lower electrodes of the cell capacitors overlaps with other lower electrodes of other cell capacitors on the first area;
a plurality of contact plugs each penetrating the lower electrodes and extending in the vertical direction, each of the contact plugs being electrically connected to an associated one of the cell transistors; and
an insulating film provided between the contact plugs and the lower electrodes,
wherein each of the contact plugs is electrically connected to an associated different one of the lower electrodes via an opening formed in the insulating film.

2. The semiconductor memory device as claimed in claim 1, wherein
the upper electrode includes a vertical portion extending in parallel to the vertical direction and a plurality of horizontal portions extending in parallel to a surface of the semiconductor substrate,
the lower electrodes and the horizontal portions are alternately stacked across the capacitor insulating film in the vertical direction, and
the horizontal portions are electrically connected to one another via the vertical portion.

3. A semiconductor memory device comprising:
a first transistor and a second transistor;
a first capacitor including a first lower electrode extending to a horizontal direction over the first and second transistors, a capacitor insulating film, and an upper electrode;
a second capacitor including a second lower electrode stacked over the first lower electrode, the capacitor insulating film, and the upper electrode, the second lower electrode extending to the horizontal direction and electrically isolated from the first lower electrode;
a first contact plug vertically penetrating the first lower electrode and the second lower electrode, the first contact plug electrically connecting the first lower electrode to the first transistor and electrically isolated from the second lower electrode; and
a second contact plug vertically penetrating the first lower electrode and the second lower electrode, the second contact plug electrically connecting the second lower electrode to the second transistor and electrically isolated from the first lower electrode,
wherein the upper electrode covers the first lower electrode, the second lower electrode, and intervening capacitor insulating film.

4. A semiconductor memory device comprising:
a semiconductor substrate having a first area;
a plurality of cell transistors arranged on the first area of the semiconductor substrate; and
a plurality of cell capacitors, each of the cell capacitors including an electrically separate lower electrode that is insulated from other lower electrodes, an upper electrode covering the lower electrode, and a capacitor insulating film provided between the lower electrode and upper electrode, the lower electrode being electrically connected to an associated one of the cell transistors, the lower electrodes of the cell capacitors being stacked in a vertical direction so that each of the lower electrodes of the cell capacitors overlaps with other lower electrodes of other cell capacitors on the first area.

5. The semiconductor memory device as claimed in claim 4, wherein the upper electrode includes a vertical portion extending in parallel to the vertical direction and a plurality of horizontal portions extending in parallel to a surface of the semiconductor substrate, the lower electrodes and the horizontal portions are alternately stacked across the capacitor insulating film in the vertical direction, and the horizontal portions are electrically connected to one another via the vertical portion.

6. The semiconductor memory device as claimed in claim 4, further comprising:

a plurality of contact plugs each penetrating the lower electrodes and extending in the vertical direction, each of the contact plugs being electrically connected to an associated one of the cell transistors; and an insulating film provided between the contact plugs and the lower electrodes, wherein each of the contact plugs is electrically connected to an associated different one of the lower electrodes via an opening formed in the insulating film.

* * * * *